United States Patent [19]
Howard et al.

[11] Patent Number: 5,214,841
[45] Date of Patent: Jun. 1, 1993

[54] MACHINE FOR PLACING SURFACE MOUNT COMPONENTS

[75] Inventors: James V. Howard, Saugus; William H. Mirley, Jr., N. Reading, both of Mass.; Steven M. Whitman, Danville; Rodney P. Jackson, Auburn, both of N.H.; William J. Loconzolo, Wakefield, Mass.

[73] Assignee: Emhart Inc., Newark, Del.

[21] Appl. No.: 949,315

[22] Filed: Sep. 23, 1992

[51] Int. Cl.$^5$ .............................. H05K 3/30
[52] U.S. Cl. ................... 29/721; 29/740; 29/743; 356/375
[58] Field of Search ........... 29/740, 721, 720, 743, 29/759, 741; 356/375, 399

[56] References Cited
U.S. PATENT DOCUMENTS

| | | | |
|---|---|---|---|
| 4,867,569 | 9/1989 | Mohara | 29/721 X |
| 5,131,139 | 7/1992 | Oyama et al. | 29/721 |

Primary Examiner—Carl E. Hall
Attorney, Agent, or Firm—Spencer T. Smith

[57] ABSTRACT

The geometric features of a supported component in a machine for mounting surface mount electronic components are either frontlighted or backlighted for inspection purposes. To backlight the features a fluorescent surface above the component is excited with UV light. Since UV light reflected from the component is invisible to the camera system, the features will appear black with a bright background. To frontlight the features, a light source is used which generates light outside the UV range and a) having a wavelength corresponding to the wavelength of the UV fluorescing surface so that no fluorescent is created or b) having a wavelength substantially different from the UV fluorescing surface that is absorbed by the surface without causing fluorescing to take place. This light when reflected from the features is seen by the camera and the features will appear bright in a dark background.

6 Claims, 1 Drawing Sheet

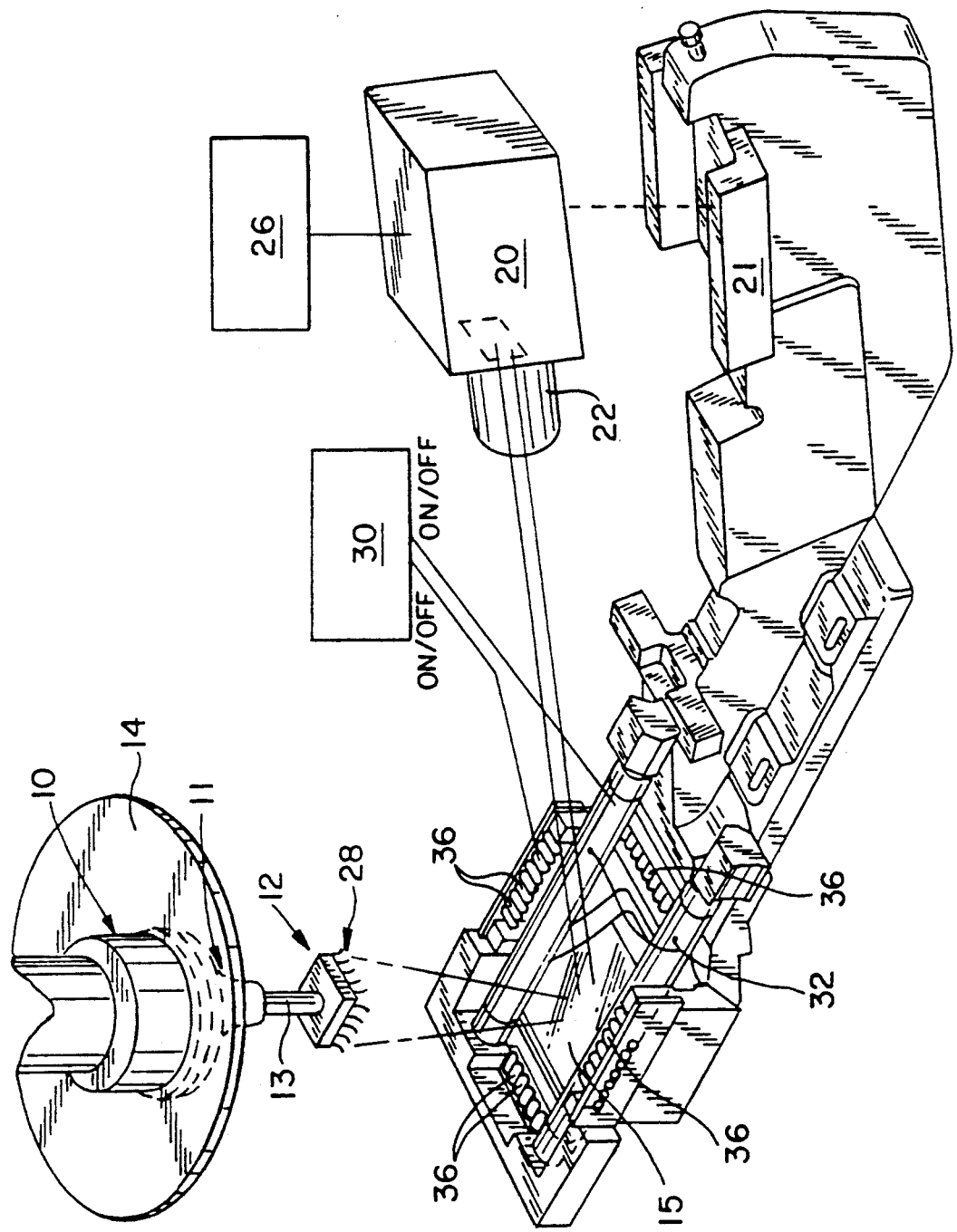

MACHINE FOR PLACING SURFACE MOUNT COMPONENTS

The present invention relates to machines for placing surface mount electronic components (SMD) on printed circuit boards and more particularly to stations on such machines for verifying the presence of the leads or contacts (geometric features) on each component.

With machine-vision inspection the most important factor is to present the inspection scene to the vision sensor in such a way as to highlight its most important features. The vision sensor "sees" by measuring varying intensities of light waves reflected from the object in the field of view. These intensities will vary depending on the part composition and geometry effecting the levels of specular and/or diffused reflection returning to the sensor.

Front lighting will highlight a SMD leaded component's metalized leads through a combination of specular and diffused reflection. Depending on the surface texture of the lead there can be varying intensities reflected back to the sensor on a part-to-part/lead-to-lead basis. Most of this light energy will be specular in nature which can cause blooming in the sensor on some leads. This blooming (saturating pixel elements) can cause system measurement errors.

Back lighting the same leaded components would present a silhouette of the part to the sensor. If the back lighting is uniform and diffuse in nature, the transition from the background to edge of the lead will be well defined and consistent from part to part. Some components, however (i.e., non-leaded and J-lead) require front lighting to highlight their features for optimum inspection.

Ideally, then, both schemes are necessary for the flexibility required to inspect a large variety of components.

It is accordingly an object of the present invention to provide an inspection system which can either back light or front light a component to be inspected.

Other objects and advantages of the present invention will become apparent from the following portion of this specification and from the accompanying drawing which illustrates in accordance with the mandate of the patent statutes a presently preferred embodiment incorporating the principles of the invention.

Referring to the drawing:

The sole figure is a perspective view of a portion of a surface mount machine made in accordance with the teachings of the present invention.

The surface mount machine includes a pickup tool head including a housing 10 having an outer pickup tool 11 which is vertically displaceable to engage and pick up a component 12 from a feeder (not shown) and to deposit that component on a printed circuit board (not shown). The pickup tool head also includes an inner tool 13. A disc shaped light emitter/ reflector/absorber 14 may be located between the tool 11 and the pickup tool housing 10. The component is held on the tools 11 or 13 by suction. The tool spindle is also displaceable rotationally so that the picked up component can be located at a precise orientation.

The inspection station includes a high resolution CCD video camera 20 supported on a base 21 which is made up of a lens 22 which focuses the image of the component reflected to the lens by a mirror 15 on a suitable sensor (not shown). The resulting analog video image is digitized to high resolution and stored in a dual-ported frame buffer and inspection is carried out by a special purpose computer 26 designed for image processing and vision analysis. Such a system utilizes high speed vision algorithms such as normalized greyscale correlation, edge detection and connectivity analysis for inspecting the leads 28 of the component.

According to the present invention an ultra violet (UV) excited fluorescing material is mixed with transparent or translucent material to form the disc and the tools 11 and 13 and may be excited by a stationary UV lamp 32. When the UV lamp 32 is powered, the pigmentation in the disc 14 and tools 11 and 13 will fluoresce in the selected visible spectra providing backlighting, while the UV radiation will not be detected by the sensor due to the absorption properties of the components, the glass lens and the sensor's lack of sensitivity to these wavelengths.

The front light system consists of a bank of light emitting diodes 36 which emit a narrow band wavelength of approximately 660 nm. (visible red). This light is outside the UV range and either has a wavelength corresponding to the wavelength of the UV fluorescing surface so that no fluorescing occurs or has a substantially different wavelength that is absorbed by the surface without causing fluorescing to take place. The fluorescing material is selected for an absorbing wavelength so that there is a minimum of reflectivity from the front lighting. If the fluorescent pigment is, in this example, green (550 NM), the light rays from the front light will become absorbed in the absorbing wavelength of the disc 14 and tools 11 and 13 causing the sensor to "see" a dark background. Both front and back lighting are realized with light sources mounted on the sensor side of the component.

A similar technique to achieve the above is to coat the light shroud and tool with a fluorescent pigmentation. The wavelengths of the fluorescing carrier and the front lighting must be selected to match and an absorbing wavelength behind the fluorescing material is necessary. If the fluorescent layer (pigment carrier) is the same wavelength as the front light, the light rays from the front light will pass through the pigment carrier and become absorbed in the absorbing background of the disc 14 and tools 11 and 13, again achieving the maximum contrast between front light and back light.

Alternate operation of the UV light source 32 and the LED light 36 is controlled by a suitable light source controller 30 which alternately turns on these sources. The component to be tested accordingly can be evaluated with backlighting, or frontlighting or with both in sequence.

We claim:

1. A machine for placing surface mount electronic components on a printed circuit board comprising
   - a tool head for holding a surface mounted electronic component having a plurality of geometric features at an inspection location,
   - said tool head including surface means for fluorescing when struck by Ultra Violet light,
   - first light source means below said held component for directing ultra violet light at said held component and said fluorescing surface means,
   - second light source means below said held component for directing light at said held component and said surface means that will not result in the fluorescing of said surface means, means for alternately operating either said first light source means or said second light source means, camera means for viewing said component geometric features when backlighted by said first light source means or front lighted by said second light source means, and means for carrying out an evaluation of the component geometric features viewed by said camera means.

2. A machine for placing surface mounted electronic components on a printed circuit board according to claim 1, wherein said fluorescing surface means includes a tool.

3. A machine for placing surface mount electronic components on a printed circuit board according to claim 2, wherein said fluorescing surface means comprises a layer of fluorescing material on said tool.

4. A machine for placing surface mount electronic components on a printed circuit board according to claim 2, wherein said fluorescing surface means includes said tool made from transparent or translucent material in which fluorescent pigmentation has been mixed.

5. A machine for placing surface mounted electronic components on a printed circuit board according to claim 1, wherein the light directed at said fluorescing surface means by said second light source means is outside the ultra violet range and has a narrow band wavelength substantially equal to the wavelength of said fluorescing surface means.

6. A machine for placing surface mounted electronic components on a printed circuit board according to claim 1, wherein the light directed at said fluorescing surface means by said second light source means has a wavelength substantially different from the fluorescing surface that is absorbed by said surface means without causing fluorescing to take place.

* * * * *